United States Patent
Sohn et al.

(10) Patent No.: US 10,969,428 B2
(45) Date of Patent: Apr. 6, 2021

(54) METHOD OF INSPECTING PATTERN DEFECT

(71) Applicant: SAMSUNG ELECTRONICS CO., LTD., Suwon-si (KR)

(72) Inventors: Young-Hoon Sohn, Incheon (KR); Chung-Sam Jun, Suwon-si (KR); Yu-Sin Yang, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 762 days.

(21) Appl. No.: 15/283,466

(22) Filed: Oct. 3, 2016

(65) Prior Publication Data

US 2017/0192052 A1 Jul. 6, 2017

(30) Foreign Application Priority Data

Dec. 31, 2015 (KR) .......................... 10-2015-0190808

(51) Int. Cl.
*G01R 31/302* (2006.01)
*G01R 31/28* (2006.01)
*G01R 31/307* (2006.01)

(52) U.S. Cl.
CPC .................................. *G01R 31/307* (2013.01)

(58) Field of Classification Search
CPC .... G01R 31/04–048; G01R 31/26–275; G01R 31/2812; G01R 31/302–311; G01N 25/72; G06T 7/00–001; H01J 7/00–001
See application file for complete search history.

(56) References Cited

U.S. PATENT DOCUMENTS

| 4,460,273 | A | * | 7/1984 | Koizumi | ................ G01N 21/89 250/559.49 |
| 4,930,889 | A | * | 6/1990 | Van Donselaar | ........................... G01N 21/95607 356/237.6 |
| 5,495,170 | A | | 2/1996 | Feeney et al. | |
| 5,680,025 | A | * | 10/1997 | Bowers | ................ G01R 31/343 318/430 |
| 6,154,039 | A | | 11/2000 | Wu | |
| 6,859,060 | B2 | | 2/2005 | Neo et al. | |
| 6,975,978 | B1 | * | 12/2005 | Ishida | .............. G01R 31/31834 324/762.03 |
| 7,521,676 | B2 | | 4/2009 | Okuda et al. | |
| 7,952,074 | B2 | | 5/2011 | Shinada et al. | |
| 8,581,153 | B2 | | 11/2013 | Chino et al. | |

(Continued)

FOREIGN PATENT DOCUMENTS

JP 05-235135 A 9/1993
JP 06-043194 A 2/1994
(Continued)

*Primary Examiner* — Huy Q Phan
*Assistant Examiner* — David B Frederiksen
(74) *Attorney, Agent, or Firm* — Lee IP Law, P.C.

(57) ABSTRACT

Provided is a method of inspecting a pattern defect. The method includes: applying a voltage to an object to be inspected and measuring an inspection signal generated in a pattern of the object to be inspected due to the voltage applied to the object to be inspected over time; generating an intensity image showing a relationship between an intensity of the inspection signal measured in the pattern and a time by processing the inspection signal; and detecting a pattern defect position by comparing the intensity image with a comparative intensity image.

14 Claims, 9 Drawing Sheets

(56) References Cited

U.S. PATENT DOCUMENTS

| | | |
|---|---|---|
| 8,618,827 B2 | 12/2013 | Shao et al. |
| 8,841,933 B2 | 9/2014 | Patterson |
| 2001/0016938 A1* | 8/2001 | Nishiyama ............ G01N 23/203 |
| | | 250/307 |
| 2001/0033683 A1* | 10/2001 | Tanaka .................... G06T 7/001 |
| | | 382/149 |
| 2003/0011355 A1* | 1/2003 | Skerritt .................. G01R 19/32 |
| | | 324/117 R |
| 2005/0104017 A1* | 5/2005 | Kimba .................... G06T 7/001 |
| | | 250/559.07 |
| 2005/0254699 A1* | 11/2005 | Sano ....................... G06T 7/001 |
| | | 382/149 |
| 2007/0115003 A1* | 5/2007 | Nikawa ................ G01R 31/311 |
| | | 324/501 |
| 2009/0250610 A1* | 10/2009 | Nara ....................... H01J 37/28 |
| | | 250/310 |
| 2011/0095781 A1* | 4/2011 | Murakami ....... G01N 21/95684 |
| | | 324/763.01 |
| 2011/0153228 A1* | 6/2011 | Ahmad .............. G01N 21/9505 |
| | | 702/40 |
| 2011/0276935 A1* | 11/2011 | Fouquet ................ G06T 7/0006 |
| | | 716/112 |
| 2012/0112066 A1* | 5/2012 | Ogiso ..................... G06T 7/001 |
| | | 250/307 |
| 2012/0303312 A1 | 11/2012 | Yun |
| 2013/0231769 A1* | 9/2013 | Tien ....................... G06T 7/001 |
| | | 700/121 |
| 2014/0061462 A1 | 3/2014 | Park et al. |
| 2014/0062521 A1* | 3/2014 | Yamada ................. G09G 3/006 |
| | | 324/762.01 |
| 2014/0133736 A1* | 5/2014 | Tien ....................... G06T 7/001 |
| | | 382/149 |
| 2014/0203815 A1* | 7/2014 | Yanase ................... G09G 3/006 |
| | | 324/501 |
| 2014/0368224 A1 | 12/2014 | Lee |
| 2015/0346261 A1* | 12/2015 | Chen ....................... H02H 3/16 |
| | | 361/93.6 |
| 2016/0274044 A1* | 9/2016 | Xie ........................ G01N 25/72 |

FOREIGN PATENT DOCUMENTS

| | | |
|---|---|---|
| JP | 2002-148323 A | 5/2002 |
| JP | 2009-252995 A | 10/2009 |
| JP | 2010-085247 A | 4/2010 |

* cited by examiner

FIG. 8

METHOD OF INSPECTING PATTERN DEFECT

CROSS-REFERENCE TO RELATED APPLICATION

Korean Patent Application No. 10-2015-0190808, filed on Dec. 31, 2015, in the Korean Intellectual Property Office, and entitled: "Method of Inspecting Pattern Defect," is incorporated by reference herein in its entirety.

BACKGROUND

1. Field

Embodiments relate to a method of inspecting a pattern defect, and more particularly, to a method of inspecting a pattern defect of a wafer or a semiconductor package.

2. Description of the Related Art

Pattern defect inspection is performed in order to prevent an electrical defect of a semiconductor device due to a pattern defect. However, as a semiconductor process is miniaturized and complicated, a size of a pattern defect that may occur during a semiconductor manufacturing process is also reduced. An inspection level requested to detect such a fine pattern defect increases and various attempts are made to accurately detect a change in electrical characteristics caused by the fine pattern defect.

SUMMARY

One or more embodiments provide a method of inspecting a defect, the method including: applying a voltage to an object to be inspected and measuring an inspection signal generated in a pattern of the object to be inspected due to the voltage applied to the object to be inspected over time; generating an intensity image showing a relationship between an intensity of the inspection signal measured in the pattern and a time by processing the inspection signal; and detecting a pattern defect position by comparing the intensity image with a comparative intensity image.

One or more embodiments provide a method of inspecting a pattern defect, the method including: measuring an inspection signal that varies according to an electrical resistance of a pattern of an object to be inspected in an entire area of the pattern over time; generating an intensity image showing a relationship between an intensity of the inspection signal measured in the entire area of the pattern and a time by processing the inspection signal; receiving from a library a comparative intensity image that is compared with the intensity image; and detecting a pattern defect position by comparing a changing trend of the intensity image over time with the comparative intensity image.

One or more embodiments provide a method of inspecting a defect, the method including applying a voltage to an object to be inspected and measuring an inspection signal generated in a pattern of the object to be inspected due to the voltage applied to the object to be inspected over time, and detecting a pattern defect by comparing the inspection signal with a normal signal over time.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
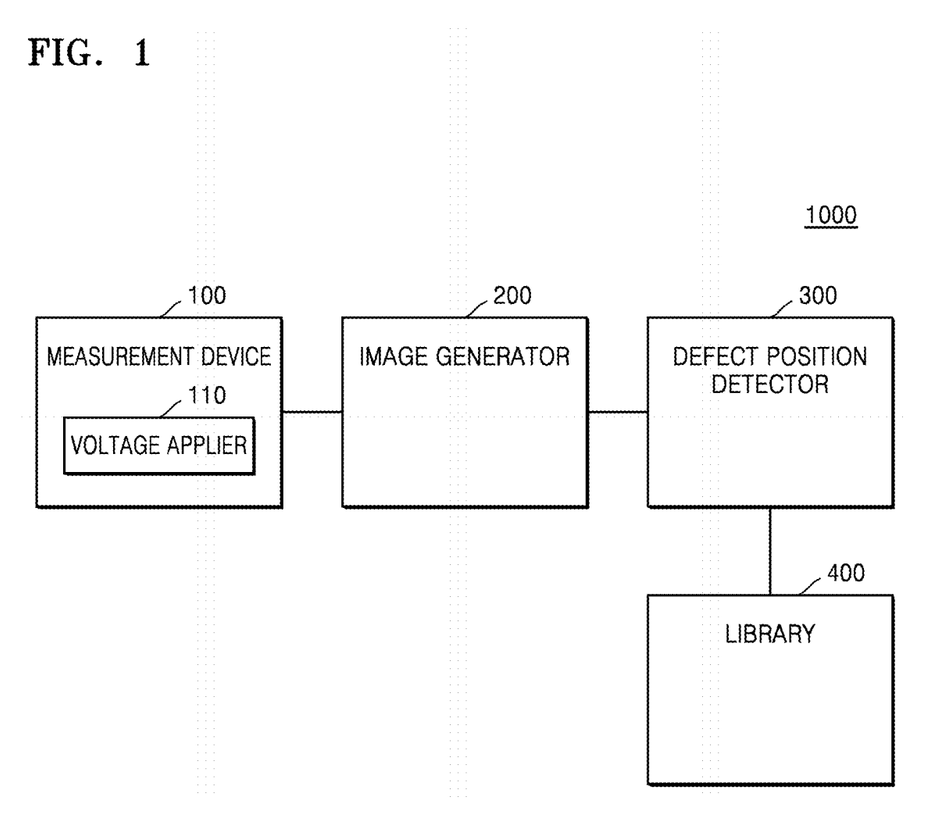
FIG. 1 illustrates a block diagram of an apparatus for inspecting a pattern defect used in a method of inspecting a pattern defect according to an embodiment.

FIG. 1 is a block diagram of an apparatus 1000 for inspecting a pattern defect used in a method of inspecting a pattern defect according to an embodiment. The apparatus 1000 may include a measurement device 100, an image generator 200, a defect position detector 300, and a library 400.

The measurement device 100 applies a voltage to an object to be inspected and then measures an inspection signal that is an electrical characteristics signal from the object to be inspected. The measurement device 100 may include a voltage applier 110 for applying a voltage to a pattern. The measurement device 100 may be used to detect an electrical characteristics signal of a surface or an internal pattern of a wafer or a surface or an internal pattern of a semiconductor package. The measurement device 100 may measure an inspection signal generated in an entire area of the pattern over time.

The voltage applier 110 applies a voltage to the wafer or the semiconductor package that is the object to be inspected, and an inspection signal that is an electrical characteristics signal is generated in the pattern due to the applied voltage. The inspection signal may be generated by using an electrical resistance as a variable.

The electrical characteristics signal may be any of various signals, e.g., heat, electrical conductivity, or optical interference, and the measurement device 100 may include a device for measuring any of the various signals. For example, the measurement device 100 may include a thermal imaging camera in order to measure a temperature distribution in the entire area of the pattern. When a voltage is applied to the object to be inspected, heat may be generated due to an electrical resistance of the pattern, thereby changing a temperature. In this case, the amount of heat generated at a portion with a pattern defect may be greater than the amount of heat generated in a normal pattern. Thus, a temperature change at a pattern defect position may be relatively large. In addition, the measurement device 100 may include a device for measuring any of various other inspection signals. For example, the measurement device 100 may include a probe for measuring an electrical conductivity in the entire area of the pattern, or may include an optical device for measuring an inspection signal by emitting light to the pattern and sensing light reflected from the pattern.

Figure 6:
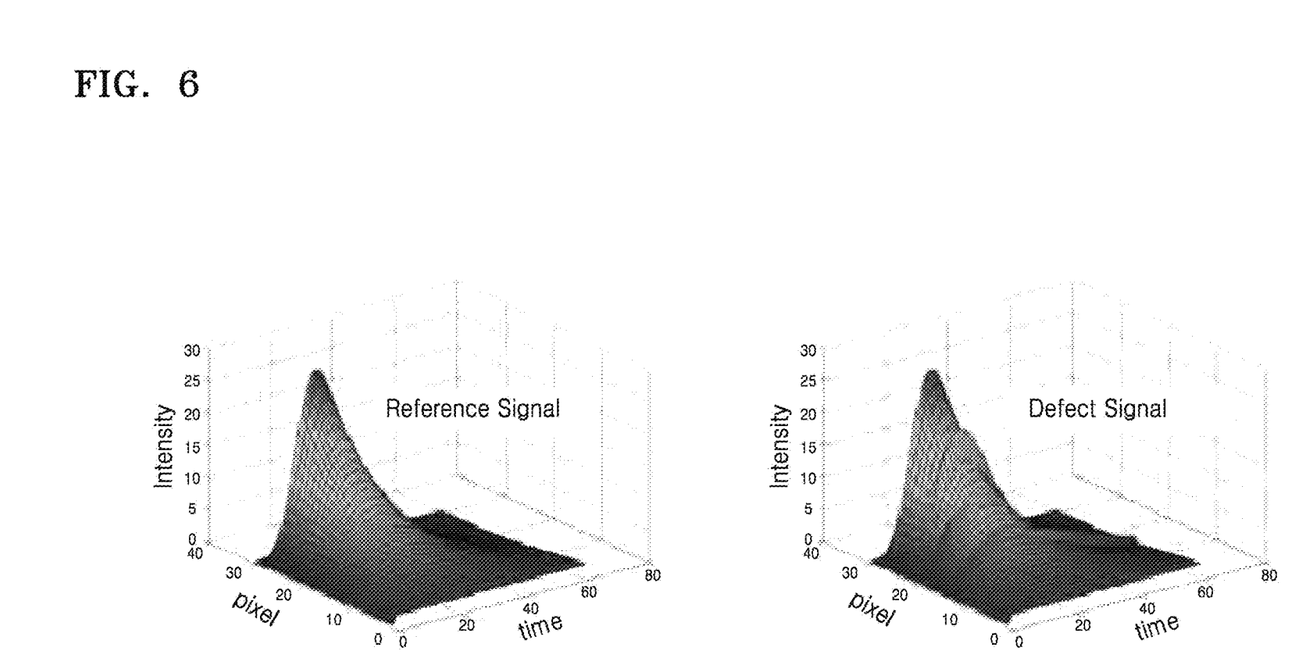
FIG. 6 illustrates a view of an intensity image according to embodiments and a comparative intensity image according to a normal signal.

The image generator 200 may receive the generated inspection signal from the measurement device 100 and may generate an intensity image as shown in FIG. 6 by processing the inspection signal. In this case, the intensity image may show a relationship between an intensity of the inspection signal at each position of the pattern and a time. The image generator 200 may transmit the intensity image to the defect position detector 300.

In detail, the intensity image may be obtained by allocating a color corresponding to an intensity of the inspection signal according to a position and according to a time. For example, the image generator 200 may divide the entire area of the pattern into a plurality of sub-areas (e.g., first through nth sub-areas) and a plurality of pixels (e.g., first through nth pixels) of the image to be generated may have pixel values corresponding to intensities of inspection signals extracted in the plurality of sub-areas. In this case, each pixel may have a color of a longer wavelength (e.g., red) when an inspection signal has a larger intensity and may have a color of a shorter wavelength (e.g., blue) when an inspection signal has a smaller intensity. Alternatively, each pixel may have a color of a shorter wavelength when an inspection signal has a larger intensity and may have a color of a longer wavelength when an inspection signal has a smaller intensity. Alternatively, intensities of inspection signals may be distinguished by light and shade, e.g., different grey levels. Any scheme that renders the different intensities readily distinct from one another, e.g., visually distinct or otherwise comprehensible by a computer, may be employed by the image generator 200.

The library 400 may store a plurality of intensity images obtained through simulations or experiments performed on the object to be inspected, as comparative intensity images. The library 400 may transmit a comparative intensity image matched to the pattern of the object to be inspected to the defect position detector 300. An intensity profile, difference profile, and pre-measured signal data related to the pattern of the object to be inspected, as well as the comparative intensity images, may be stored in the library 400.

The defect position detector 300 may receive the intensity image from the image generator 200, may receive the comparative intensity image from the library 400, and may analyze a changing trend of the intensity image and the comparative intensity image over time, thereby specifying a pattern defect position. The defect position detector 300 may include a computer with algorithms for processing an inspection signal and a display device for displaying an intensity image. The defect position detector 300 may find the comparative intensity image, which may be matched to the intensity image received from the image generator 200, from the library 400.

The defect position detector 300 may detect a pattern defect position by comparing the intensity image with the comparative intensity image. The defect position detector 300 may detect a pattern defect position by analyzing peak points of the intensity image and the comparative intensity image and/or generating a difference image between the intensity image and the comparative intensity image. Furthermore, the defect position detector 300 may detect a pattern defect position by using an intensity profile and/or inspection signal data, instead of the intensity image. A method of specifying a pattern defect position will be explained below in detail.

Figure 2:
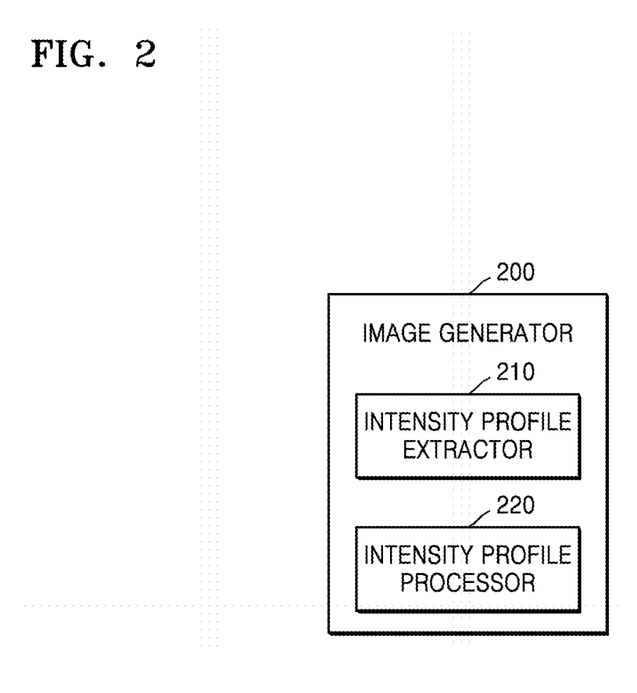
FIG. 2 illustrates a block diagram of an image generator of FIG. 1.

FIG. 2 is a block diagram of the image generator 200 of FIG. 1. Referring to FIG. 2, the image generator 200 may include an intensity profile extractor 210 and an intensity profile processor 220.

Figure 5:
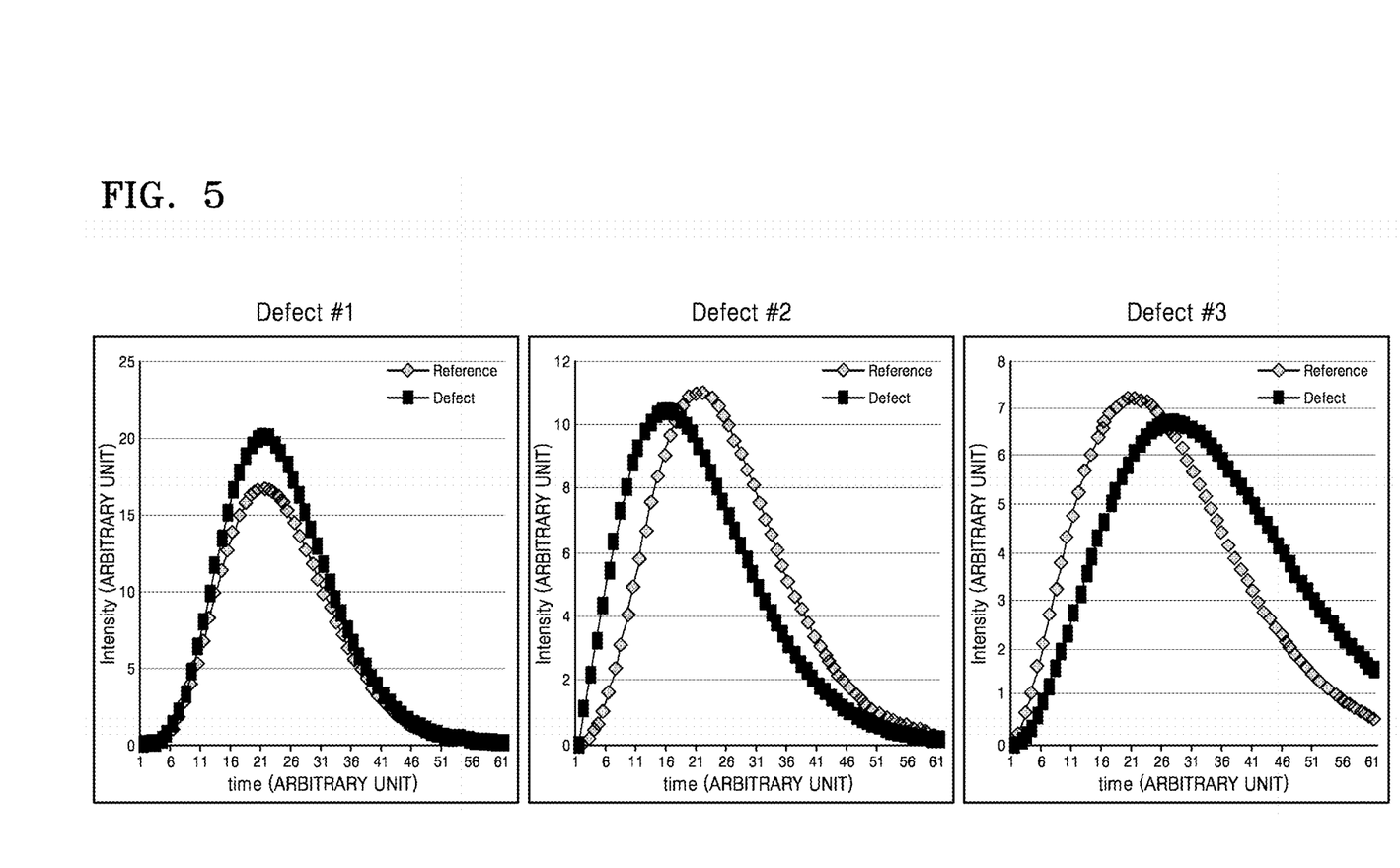
FIG. 5 illustrates a view of intensity profiles generated by processing inspection signals measured from the first through third pattern defects of the pattern of FIG. 4 and a comparative intensity profile according to a normal signal.

The intensity profile extractor 210 may extract an intensity profile by using an inspection signal received from the measurement device 100. The intensity profile may show an intensity of the inspection signal at a specific position of a pattern over time as shown in FIG. 5.

The intensity profile processor 220 may generate an intensity image showing the inspection signal in an entire area of the pattern over time by integrating a plurality of intensity profiles received from the intensity profile extractor 210.

Figure 3A:
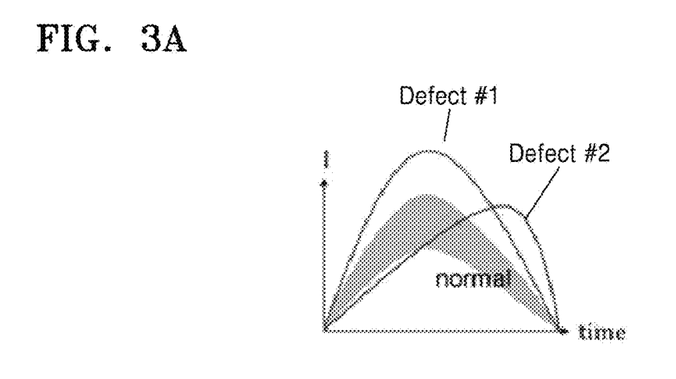
FIG. 3A illustrates a graph showing a relationship between intensities of inspection signals measured from a first pattern defect and a second pattern defect and a time.
Figure 3B:
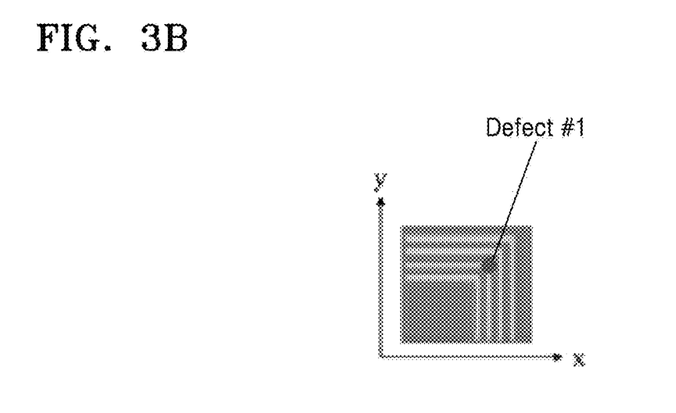
FIG. 3B illustrates an image generated by pattern defect inspection performed according to a comparative example.
Figure 3C:
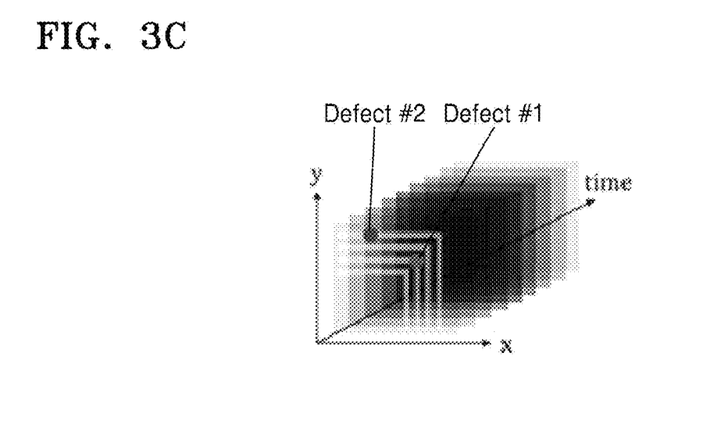
FIG. 3C illustrates an image generated by pattern defect inspection performed according to an embodiment.

FIG. 3A is a graph showing a relationship between intensities of inspection signals measured from a first pattern defect and a second pattern defect over time. FIG. 3B is an image generated by pattern defect inspection performed according to a comparative example. FIG. 3C is an image generated by pattern defect inspection performed according to an embodiment.

First, as shown in FIG. 3A, an inspection signal measured from a first pattern defect Defect #1 has an intensity greater than a noise range of a normal signal over an entire time interval. An inspection signal measured from a second pattern defect Defect #2 has an intensity within the noise range of the normal signal, but has a changing trend over time that is different from that of the normal signal.

According to the comparative example of FIG. 3B, if an inspection signal is not processed over time, but only processed at a specific point of time, only a two-dimensional (2D) spatial image is generated. In this case, pattern defect inspection is performed by analyzing an intensity difference between the inspection signal and a normal signal at a specific point in time without analyzing a change of the inspection signal over time. As shown in the image of FIG. 3B, the first pattern defect Defect #1 may be detected. Since an inspection signal measured from the first pattern defect Defect #1 has an intensity greater than a noise range of a normal signal, a pattern defect may be specified by comparing intensities of the inspection signal and the normal signal. However, as shown in the image of FIG. 3B, the second pattern defect Defect #2 is not detected. Since an inspection signal measured from the second pattern Defect #2 has an intensity within the noise range of the normal signal, it is difficult to determine whether there is a pattern defect by using a method of simply comparing intensities at specific, individual points in time.

FIG. 3C illustrates an image generated by processing an inspection signal of an entire area of a pattern over time. The second pattern defect Defect #2 that is not detected in FIG. 3B may be detected by analyzing a changing trend over time. For example, an inspection signal measured from the second pattern defect Defect #2 is different from a normal signal in a time at which each signal reaches a peak point. Accordingly, a pattern defect may be detected by comparing the peak points of the inspection signal and the normal signal. That is, even when it is difficult to detect a pattern defect by comparing intensities, a signal measured from a pattern may be analyzed over a time interval, thereby improving the detection efficiency of an apparatus for inspecting a pattern defect. Even in FIG. 3C, like in FIG. 3B, since an inspection signal measured from the first pattern defect Defect #1 has an intensity greater than a noise range of a normal signal, the first pattern defect Defect #1 may be detected by comparing intensities of the inspection signal and the normal signal.

Figure 4:
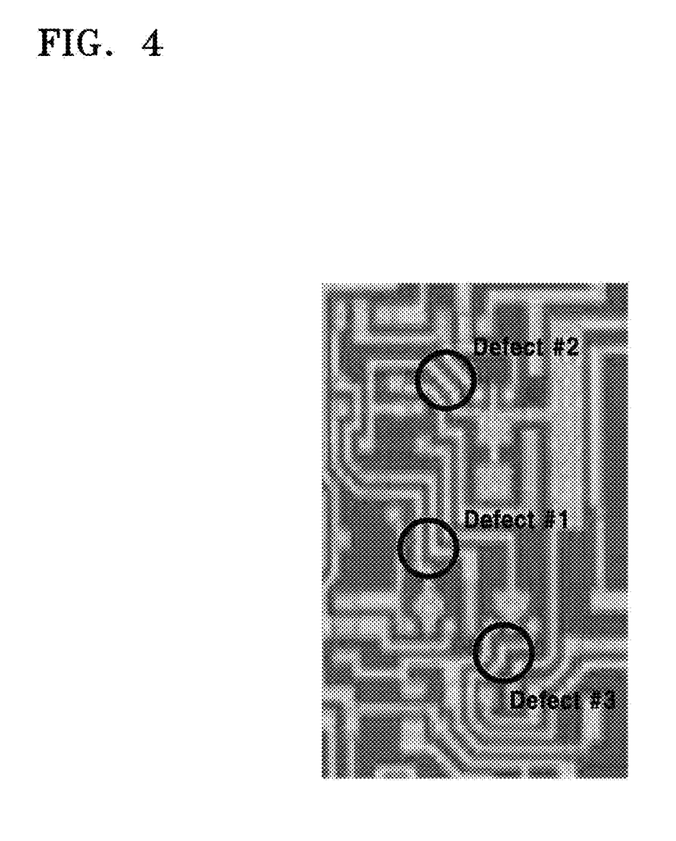
FIG. 4 illustrates a view of a pattern having first through third pattern defects.

FIG. 4 is a view illustrating a pattern having first through third pattern defects. FIG. 5 is a view illustrating intensity profiles generated by processing inspection signals measured from the first through third pattern defects of the pattern of FIG. 4 and a comparative intensity profile according to a normal signal.

Referring to FIGS. 4 and 5, each of intensity profiles generated by processing inspection signals measured from first through third pattern defects Defect #1 through Defect #3 shows an intensity change of an inspection signal over time at a specific position. A comparative intensity profile according to a normal signal that is compared with the intensity profiles may be received from a library.

As shown in the intensity profile of the first pattern defect Defect #1, an intensity of an inspection signal is increased in an entire time interval due to a pattern defect. The defect position detector 300 may specify the first pattern defect Defect #1 as a pattern defect by comparing only intensities of the inspection signal and the normal signal at specific points in time. For example, a level of a peak point of the intensity of the inspection signal may exceed a noise range of a normal signal, and the defect position detector 300 may determine whether there is a pattern defect only by analyzing levels of peak points of the inspection signal and the normal signal.

Unlike the first pattern defect Defect #1, an intensity difference between an inspection signal and a normal signal in each of the second pattern defect Defect #2 and the third pattern defect Defect #3 is not relatively large, and thus it may be difficult to determine whether there is a pattern defect by simply comparing intensities at specific points in time. Accordingly, as in the second pattern defect Defect #2 and the third pattern defect Defect #3, when the intensity difference is relatively small (for example, when the inspection signal is within a noise range of the normal signal), whether there is a pattern defect has to be determined by analyzing a changing trend in an intensity of the inspection signal according to a time.

First, as shown in the intensity profile of the second pattern defect Defect #2, the inspection signal of the second pattern defect Defect #2 reaches a peak point earlier than the normal signal. Accordingly, when the intensity profile of the second pattern defect Defect #2 and an intensity profile of the normal signal are compared with each other, the intensity profile of the second pattern defect Defect #2 increases rapidly to a peak point and decreases slowly after the peak point. The defect position detector 300 determines whether there is a pattern defect by analyzing a changing trend of an intensity of the inspection signal and an intensity of the normal signal according to a time. For example, the defect position detector may specify a pattern defect by comparing a time when the inspection signal reaches the peak point with a time when the normal signal reaches a peak point.

As shown in the intensity profile of the third pattern defect Defect #3, an inspection signal of the third pattern defect Defect #3 reaches a peak point later than a normal signal. Accordingly, when the intensity profile of the third pattern defect Defect #3 and an intensity profile of the normal signal are compared with each other, the intensity profile of the third pattern defect Defect #3 increases slowly to a peak point and decreases rapidly after the peak point. Accordingly, the defect position detector 300 determines whether there is a pattern defect by analyzing a changing trend of an intensity of the inspection signal and an intensity of the normal signal according to a time. For example, the defect position detector may specify a pattern defect by comparing a time when the inspection signal reaches the peak point with a time when the normal signal reaches a peak point.

When whether there is a pattern defect is determined by using a time when a signal reaches a peak point and a level of the peak point, the defect position detector may use a differential intensity profile generated by differentiating an intensity profile in order to analyze the peak point and/or may use a difference profile between the intensity profile and a comparative intensity profile.

FIG. 6 is a view illustrating an intensity image according to embodiments and a comparative intensity image according to a normal signal. In FIG. 6, intensity images generated by using inspection signals measured in an entire area of a pattern are arranged in an order from higher peak points. The comparative intensity image may be matched to the intensity images and may be received from a library.

Each of the intensity images shows a relationship between an intensity of the inspection signal measured in the entire area of the pattern over time. The intensity image may be obtained by allocating a color corresponding to the intensity of the inspection signal to a pixel according to a position of the pattern and an inspection time. For example, an image generator may divide the entire area of the pattern into a plurality of sub-areas, and then may apply pixel values corresponding to intensities of inspection signals measured in the plurality of sub-areas to a plurality of corresponding pixels in the image. Accordingly, since each of the plurality of pixels corresponds to one of the plurality of sub-areas, the plurality of pixels may include position information of the pattern. Also, a pixel value of each pixel may indicate an intensity of an inspection signal at a position of a sub-area corresponding to the pixel, and a change in the pixel value of the pixel may indicate a change in the inspection signal measured in the sub-area corresponding to the pixel over time. In this case, each pixel may have a color of a longer wavelength when an inspection signal has a larger intensity and may have a color of a shorter wavelength when an inspection signal has a smaller intensity.

The defect position detector may specify a pattern defect position by analyzing a changing trend in the intensity image and the comparative intensity image over time. For example, the defect position detector may determine whether there is a pattern defect by analyzing a time when a signal reaches a peak point of each pixel and a level of the peak point or by generating a difference image which will be explained below.

Figure 7A:
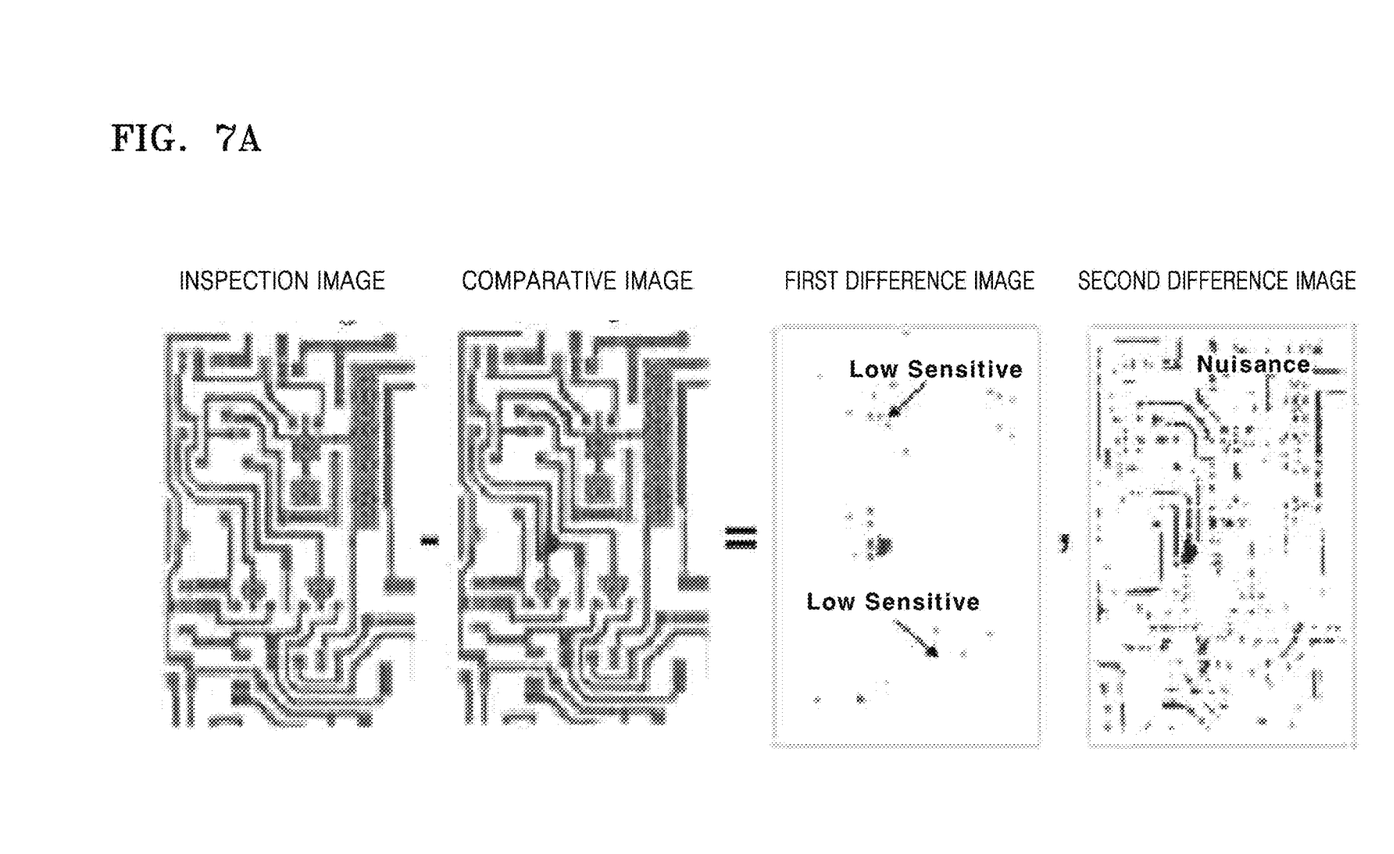
FIG. 7A illustrates a view for explaining a method of detecting a pattern defect of the pattern of FIG. 3 according to a comparative example.
Figure 7B:
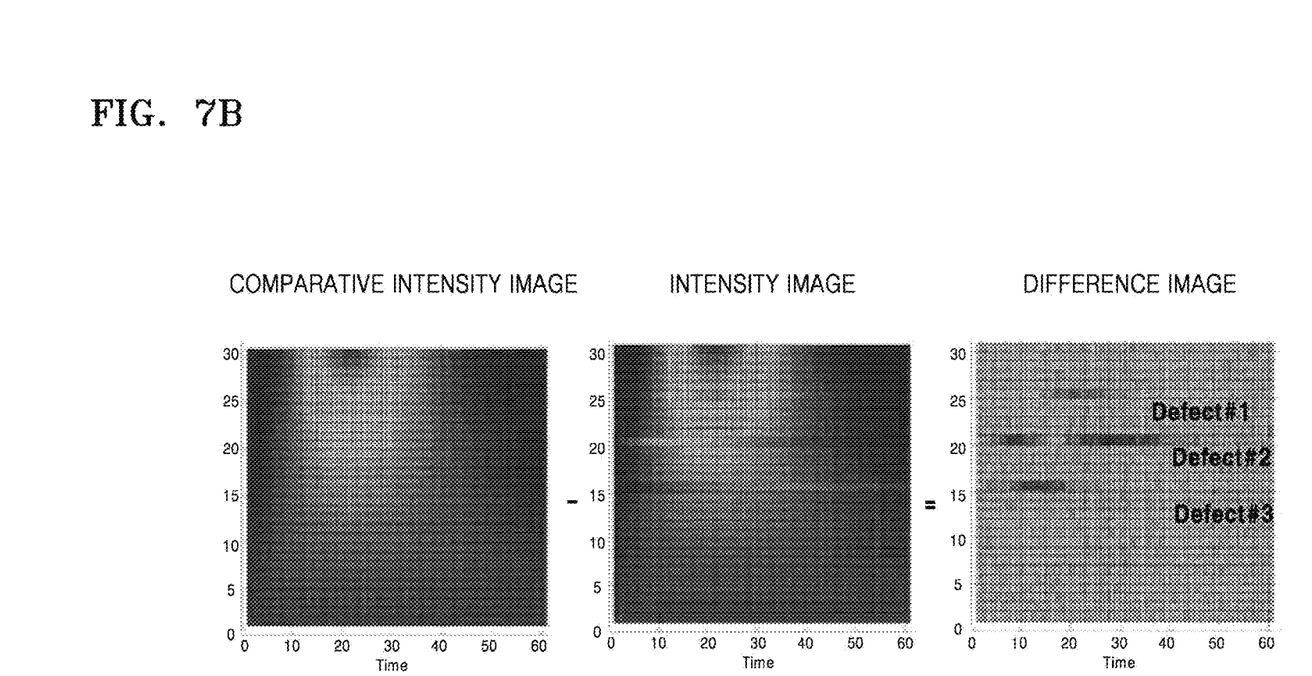
FIG. 7B illustrates a view for explaining a method of detecting a pattern defect of the pattern of FIG. 3 according to an embodiment.

FIG. 7A is a view for explaining a method of detecting a pattern defect of the pattern of FIG. 3 according to a comparative example. FIG. 7B is a view for explaining a method of detecting a pattern defect of the pattern of FIG. 3 according to an embodiment.

Referring to FIGS. 7A and 3, pattern defect inspection according to a comparative example involves detecting a pattern defect position by generating a difference image between an inspection image generated by processing a defect signal measured from a pattern defect and a comparative image according to a normal signal. In this case, the inspection image and the comparative image do not include information about a change in an intensity of the inspection signal over time, unlike in embodiments, and are thus simply 2D spatial images.

A first difference image is an image when a signal threshold for selecting a defect is increased. A signal measured from the first pattern defect Defect #1 has a relatively large intensity difference from a normal signal, and thus may be displayed in a difference image. Accordingly, the first pattern defect Defect #1 may be detected as a pattern defect by using the difference image. In contrast, each of signals measured from the second pattern defect Defect #2 and the third pattern defect Defect #3 has a relatively small intensity difference from the normal signal, and thus is rarely displayed in the difference image. Accordingly, the second pattern defect Defect #2 and the third pattern defect Defect #3 are not detected as pattern defects. That is, when inspection is performed by increasing a signal threshold, it is difficult to detect the second pattern defect Defect #2 and the third pattern defect Defect #3 due to a low sensitivity, resulting in numerous defective patterns being accepted.

Also, if a signal threshold is reduced in order to increase detection efficiency, this will result in numerous patterns that do not actually have defects that would affect performance would be rejected, increasing manufacturing costs. Although all of the first through third pattern defects Defect #1 through Defect #3 would be detected in this difference image with a decreased signal threshold, an electrical difference that does not affect an actual product is also detected.

Referring to FIGS. 7B and 3, each of an intensity image and a comparative intensity image is provided as a map showing a relationship among an intensity of an inspection signal, a position of a pattern, and an inspection time, and a difference image between the intensity image and the comparative intensity image is also provided as a map.

As shown in the difference image, a portion with a pattern defect is clearly different from a normal pattern. That is, a color of a pixel in a portion with a pattern defect varies over time whereas a color in the normal pattern rarely varies over time. Accordingly, a pixel whose color varies over time may be detected in the difference image and a pattern position corresponding to the pixel may be specified as a pattern defect.

In detail, an intensity of an inspection signal measured from the first pattern defect Defect #1 is generally large due to a pattern defect and an intensity profile of the inspection signal measured from the first pattern defect Defect #1 may be the same as that in FIG. 5. A pixel corresponding to a position of the first pattern defect Defect #1 in the difference image may be gradually changed to a color of a longer wavelength and then may be gradually changed to a color of a shorter wavelength in a certain interval.

In contrast, inspection signals measured from the second pattern defect Defect #2 and the third pattern defect Defect #3 are different from a normal signal in terms of a changing trend over time, e.g. these profiles may diverge from, i.e., be shifted relative to, that of a normal signal over time. Intensity profiles of the inspection signals measured from the second pattern defect Defect #2 and the third pattern defect Defect #3 may be the same as those in FIG. 5. A color of each of pixels corresponding to the second pattern defect Defect #2 and the third pattern defect Defect #3 in the difference image may gradually change to a color of a longer wavelength and then to a color of a shorter wavelength, in a first interval, and may be gradually change to a color of a shorter wavelength and then to a color of a longer wavelength, in a second interval, as the difference between the intensities of the pattern defects and the normal signal gradually increase, then decrease, and then increase again in the specific pattern defects illustrated.

In other words, rather than statically evaluate the intensities of the inspection signal and the normal signal, a difference map that indicates that the differences between the inspection signal and the normal signal are not relatively constant may indicate a pattern defect even when an absolute value of the difference between the inspection signal and the normal signal never exceeds the signal threshold. As may be seen with respect to the second pattern defect Defect #2 and the third pattern defect Defect #3, even though the difference values between the inspection signal and the normal signal are not as large at any given specific point in time as that in the first pattern defect Defect #1, the overall differences over time of the second pattern defect Defect #2 and the third pattern defect Defect #3 may be greater than that of the first pattern defect Defect #1, indicating a pattern defect. Thus, while the peak intensities in the second pattern defect Defect #2 and the third pattern defect Defect #3 may be closer to the normal signal than that of the first pattern defect Defect #1, these may still represent a pattern defect. For example, a total sum of the difference signals over time for the second pattern defect Defect #2 or the third pattern defect Defect #3 may be greater than that for first pattern defect Defect #1, and this total sum may be compared to the signal threshold to determine whether a pattern defect is present.

Figure 8:
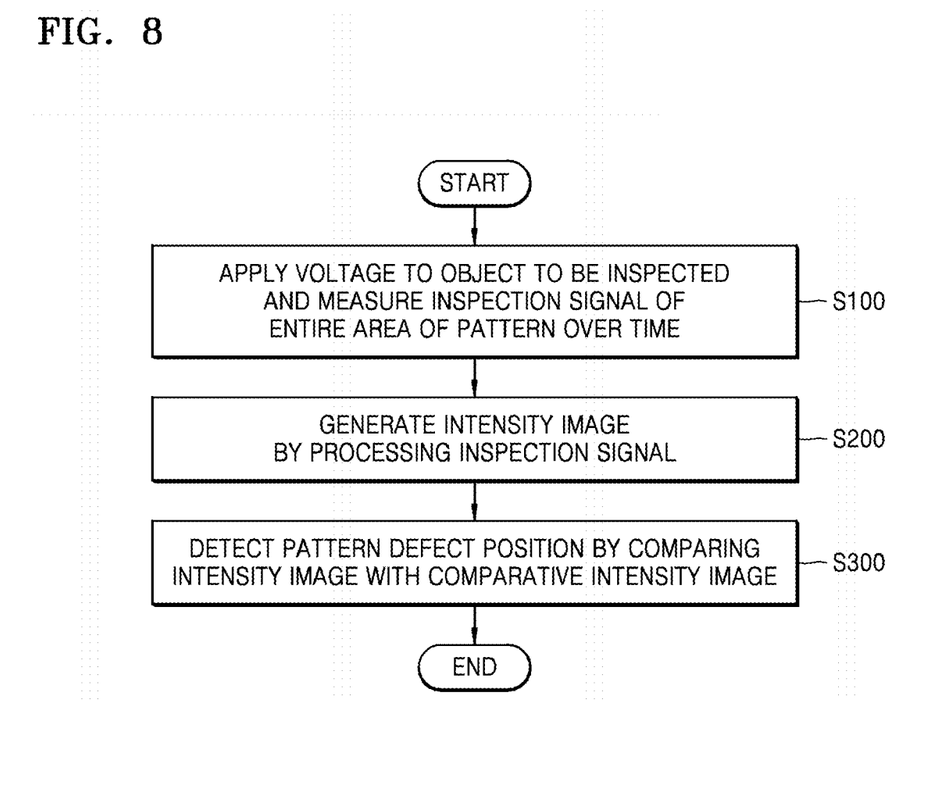
FIG. 8 illustrates a flowchart of a method of inspecting a pattern defect according to an embodiment.

FIG. 8 is a flowchart of a method of inspecting a pattern defect according to an embodiment.

Referring to FIG. 8, first, in operation S100, a voltage is applied to an object to be inspected and an inspection signal of an entire area of a pattern is measured over time. The object to be inspected may a wafer or a semiconductor package, and an electrical characteristics signal generated from a surface or an internal pattern of the wafer or the semiconductor package due to the applied voltage is measured as an inspection signal. The inspection signal may indicate an intensity that varies according to an electrical resistance of the pattern.

Next, in operation S200, an intensity image is generated by processing the inspection signal. The intensity image shows a relationship between an intensity of the inspection signal measured in the entire area of the pattern and over time. The intensity image may be obtained by allocating a color corresponding to the intensity of the inspection signal. That is, the intensity image may show a relationship between an inspection signal, a position in the pattern, and an inspection time by dividing the entire area of the pattern into a plurality of sub-areas and allocating pixel values corresponding to intensities of inspection signals measured in the plurality of sub-areas to a plurality of corresponding pixels.

Also, generating the intensity image may include generating an intensity profile by processing the inspection signal and generating the intensity image by integrating the intensity profile. In this case, the intensity profile may show an intensity of the inspection signal at a specific pattern position in a time interval.

In operation S300, a pattern defect position is detected by comparing the intensity image with a comparative intensity image. In this case, the comparative intensity image that is matched to the intensity image of the pattern of the object to be inspected is received from a library. The comparative intensity image may be obtained through simulations or experiments performed on the object to be inspected. The comparative intensity image shows a relationship between an intensity of a signal measured from the entire area of the pattern and a time, like the intensity image. Next, peak points of the intensity image and the comparative intensity image at a specific position of the pattern may be analyzed in order to specify a pattern defect. A defect signal due to a pattern defect may be different from a normal signal in a time at which each signal reaches a peak point and/or an intensity at the peak point. Accordingly, a pattern position where there is a difference in a time at which a signal reaches a peak point and/or an intensity between the intensity image and the comparative intensity image may be specified as a portion with a pattern defect. In some embodiments, an intensity profile may be used to analyze peak points and/or a differential intensity profile generated by differentiating the intensity profile may be used.

Also, a difference image between the intensity image and the comparative intensity image may be used in order to specify a pattern defect. Each of the intensity image, the comparative intensity image, and the difference image may be represented as a graph indicating an intensity of an inspection signal according to a position axis and a time axis of the pattern. When there is a pattern defect, a difference image corresponding to a pattern defect position has a color that varies according to a time, unlike images of other portions. A pattern position where a color varies according to a time may be specified as a portion with a pattern defect.

A method of inspecting a pattern defect performed by using an apparatus for inspecting a pattern defect according to the one or more embodiments may be used to improve a semiconductor process. A pattern defect position of a wafer or a semiconductor package may be found and a cause of the pattern defect may be analyzed by using the method. A process with the pattern defect may be analyzed by analyzing the cause of the pattern defect. Process yield may be improved by analyzing the cause of the pattern defect and then improving a semiconductor process by reflecting a result of the analysis. Also, pattern defect inspection may be performed in-line, and once the pattern defect is detected, the semiconductor process may be stopped to prevent disposal of a finished product due to a defect.

Embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of inspecting a defect, the method comprising:
    applying a voltage to an object to be inspected;
    measuring an inspection signal generated from a pattern of the object to be inspected from a first to a second time;
    generating an intensity image by processing the inspection signal, the intensity image showing a change of an intensity of the inspection signal from the first time to the second time; and
    detecting a pattern defect position by comparing the intensity image with a comparative intensity image, the comparative intensity image showing a change of an intensity of a normal signal from the first time to the second time, and comparing a time at which a peak point of the inspection signal is reached and a time at which a peak point of the normal signal is reached.

2. The method as claimed in claim 1, wherein the inspection signal has an intensity that varies according to an electrical resistance of the pattern of the object to be inspected.

3. The method as claimed in claim 1, wherein detecting the pattern defect position includes generating a difference image between the intensity image and the comparative intensity image, the difference image showing a difference between the intensity of the inspection signal and the intensity of the normal signal from the first time to the second time.

4. The method as claimed in claim 1, wherein generating the intensity image comprises:
    generating intensity profiles based on the inspection signal; and
    generating the intensity image by integrating the intensity profiles.

5. The method as claimed in claim 1, before detecting the pattern defect position, further comprising receiving the comparative intensity image from a library.

6. The method as claimed in claim 1, wherein measuring includes measuring a temperature of an entire area of the pattern from the first time to the second time.

7. The method as claimed in claim 1, wherein measuring includes an electrical conductivity of an entire area of the pattern from the first time to the second time.

8. The method as claimed in claim 1, wherein detecting the pattern defect position further includes comparing a level of the peak point of the inspection signal and a level of the peak point of the normal signal.

9. The method as claimed in claim 1, wherein the intensity image includes plurality of pixels, each of the plurality of pixels having a color corresponding to the intensity of the inspection signal at a sub-area of the pattern.

10. A method of inspecting a pattern defect, the method comprising:
   applying a voltage to an object to be inspected;
   measuring an inspection signal generated from a pattern of the object to be inspected from a first time to a second time;
   generating an intensity profile by processing the inspection signal, the intensity profile showing a change of an intensity of the inspection signal from the first time to the second time; and
   detecting a pattern defect position by comparing a time at which the intensity profile reaches a peak point with a time at which a comparative intensity profile reaches a peak point, the comparative intensity profile showing a change of an intensity of a normal signal from the first time to the second time.

11. The method as claimed in claim 10, wherein detecting the pattern defect position further includes comparing a level of the peak point of the inspection signal and a level of the peak point of the normal signal.

12. The method as claimed in claim 10, further comprising generating an intensity image by integrating a plurality of intensity profiles, each of the plurality of intensity profiles showing an intensity change at each of a plurality of sub-areas of the pattern from the first time to the second time.

13. The method as claimed in claim 10, further comprising generating a comparative intensity image by integrating a plurality of comparative intensity profiles, each of the plurality of comparative intensity profiles showing an intensity change at each of a plurality of sub-areas of a normal pattern from the first time to the second time.

14. The method as claimed in claim 10, before detecting the pattern defect position, further comprising receiving the comparative intensity profile from a library.

* * * * *